United States Patent [19]

Ueno

[11] Patent Number: 5,696,406
[45] Date of Patent: Dec. 9, 1997

[54] SEMICONDUCTOR DEVICE AND METHOD FOR FABRICATING THE SAME

[75] Inventor: Hisashi Ueno, Tokyo, Japan

[73] Assignee: NEC Corportion, Tokyo, Japan

[21] Appl. No.: 317,191

[22] Filed: Oct. 3, 1994

[30] Foreign Application Priority Data

Oct. 29, 1993 [JP] Japan .................. 5-271107

[51] Int. Cl.⁶ .................. H01L 27/06; H01L 27/04
[52] U.S. Cl. .................. 257/784; 257/779; 257/786
[58] Field of Search .................. 257/774, 786, 257/748, 784, 779

[56] References Cited

U.S. PATENT DOCUMENTS 5,223,084  6/1993  Uesato et al. .................. 257/774

FOREIGN PATENT DOCUMENTS 61-78151  4/1986  Japan .................. 257/774
6-29471  2/1994  Japan .................. 257/786

OTHER PUBLICATIONS

"Jun. 11–12, 1991 VMIC Conference", pp. 144 to 152.

*Primary Examiner*—Donald Monin
*Attorney, Agent, or Firm*—Laff, Whitesel, Conte, & Saret, Ltd.

[57] ABSTRACT

A first groove for an upper interconnection and a second groove for a bonding pad are formed on a silicon dioxide film including a lower interconnection, and a through-hole is formed to connect the first groove to the lower interconnection. At the same time with the formation of the through-hole, the second groove is deepened by the common etching process. Then, an Al film is formed on the silicon dioxide film, and the Al film is polished to be removed except for the Al film in the first and second grooves to provide the upper interconnection and the bonding pad.

2 Claims, 2 Drawing Sheets

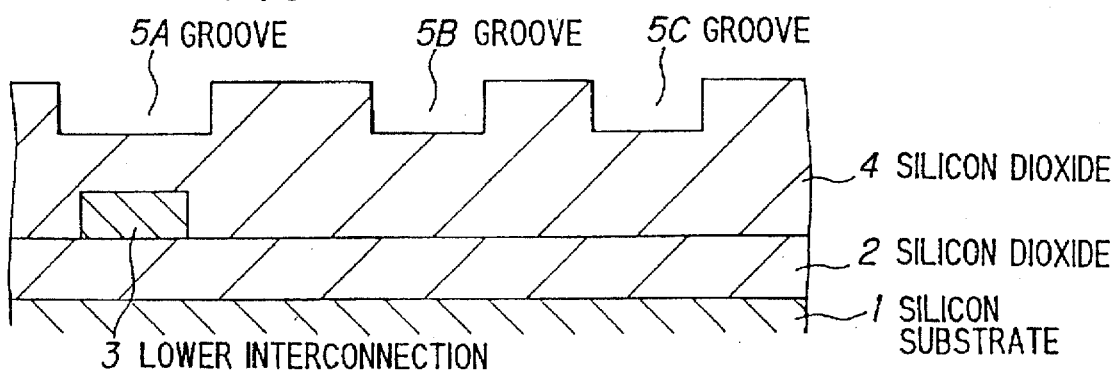
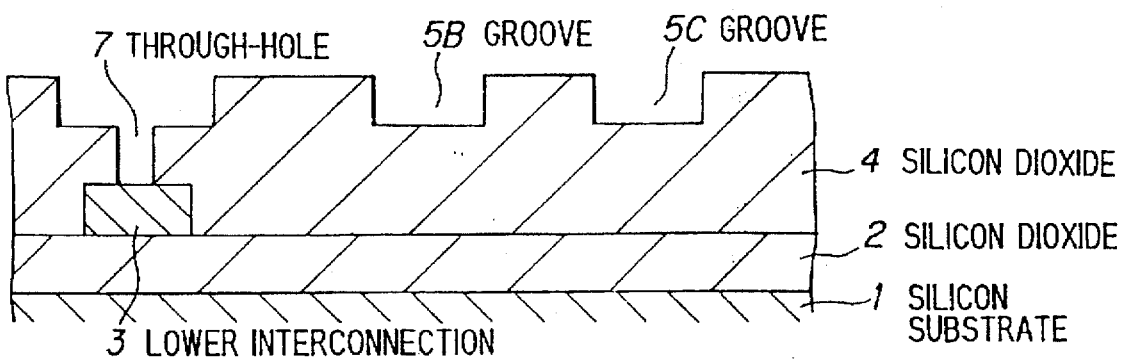
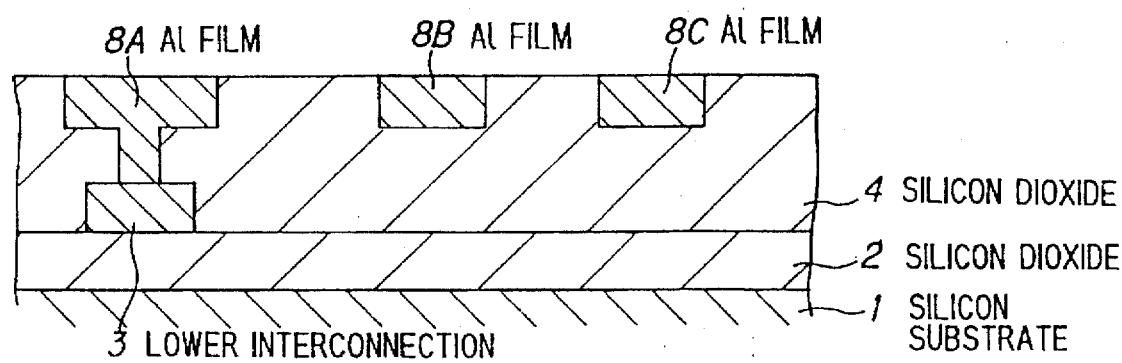
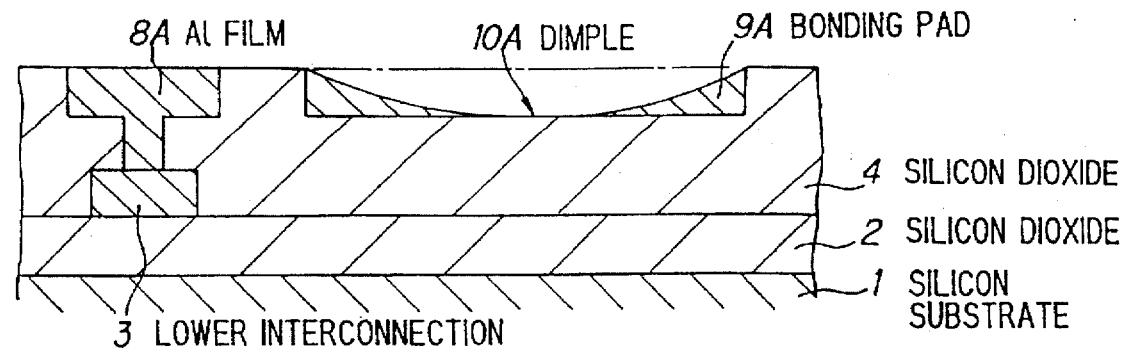

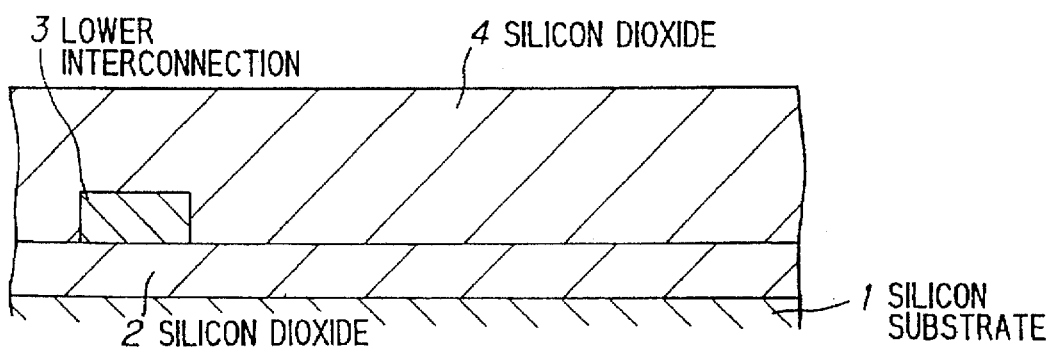
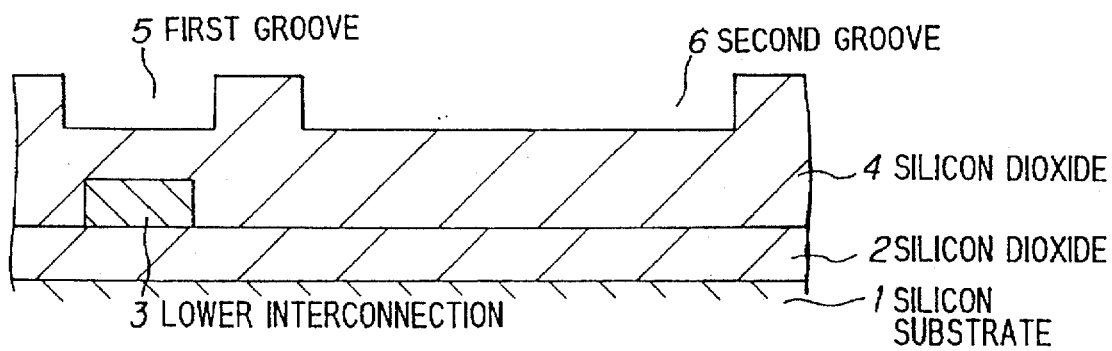
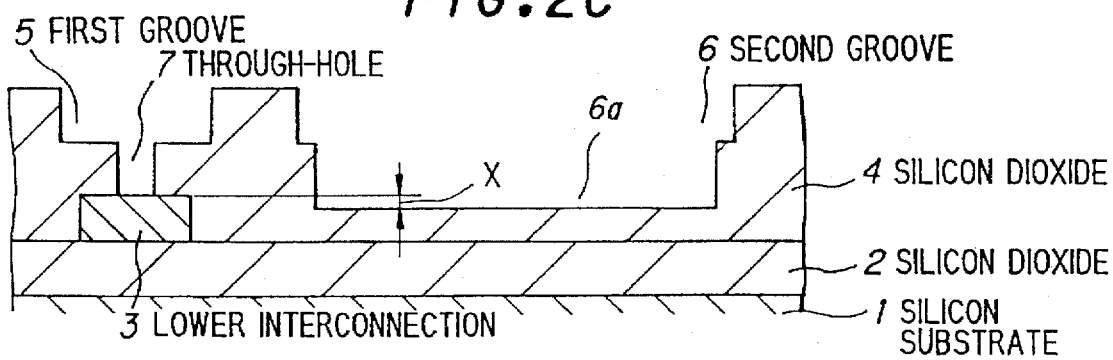
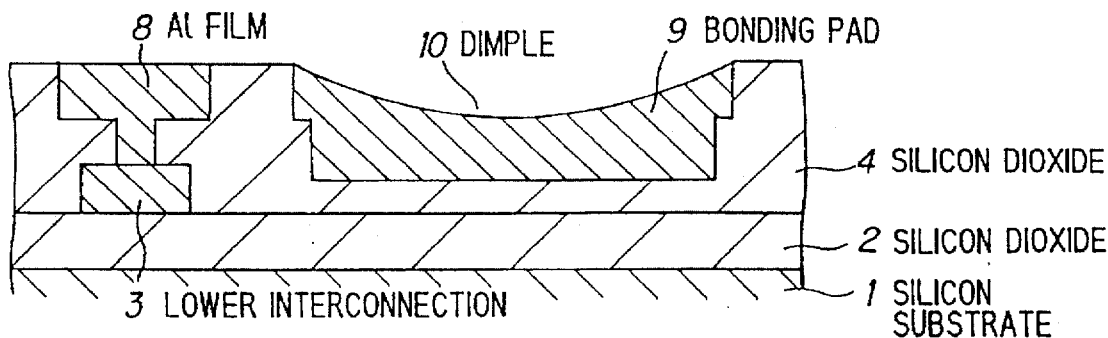

SEMICONDUCTOR DEVICE AND METHOD FOR FABRICATING THE SAME

FIELD OF THE INVENTION

The invention relates to a semiconductor device and a method for fabricating a semiconductor device, and more particularly to, the improvement on a conductive film formed in a groove or a trench in a semiconductor device.

BACKGROUND OF THE INVENTION

The multi-layer interconnection technology for super LSIs has some problems, in one of which the formation of fine interconnections becomes difficult due to the narrow margin of a focus depth in lithography process, because an absolute step difference becomes large for upper interconnections. For this reason, a complete flatness is required for a semiconductor device of a multi-layer interconnection structure of more than four layers.

In order to overcome these problems, CMP (Chemical-Mechanical Polish) process is proposed, wherein insulating films and metal films are polished with respective polishing rates.

In the CMP process, a polishing pad is fixed on a fixed board, and a wafer is placed to be pressed by a predetermined load on the pad on the fixed board which is rotated, while polishing liquid including silica particles is supplied to a polishing surface of the wafer on the polishing pad. In consequence, only protruded portions on the wafer is polished to be flat on the polishing surface thereof.

A process for fabricating buried interconnections by using the CMP process is described on pages 144 to 152 of "June 11–12, 1991 VMIC Conference". This process will be explained in the description of the preferred embodiment according to the invention.

In the CMP process, however, there is a disadvantage in that the so-called dishing phenomenon in which a dimple is formed to decrease a thickness of one of at least two films grown with the same thickness on a semiconductor substrate is observed, when the at least two films have different polishing rates as seen, for instance, in an Al film and a silicon dioxide film.

The Al film has a polishing rate faster than that of the silicon dioxide film, so that a dimple which is formed on an Al bonding pad formed in a groove of a silicon dioxide interfacial film decreases a thickness of the Al bonding pad in the central portion thereof. This tends to result in a fault in bonding a wire to the thickness-decreased bonding pad.

SUMMARY OF THE INVENTION

Accordingly, it is an object of the invention to provide a semiconductor device and a method for fabricating a semiconductor device in which a local extinction never occurs in a conductive film, even if a thickness of the conductive film is decreased by a dimple which is formed in the CMP process.

According to the feature of the invention, a semiconductor device, comprises:

a semiconductor substrate; an insulating film having first and second grooves provided on the semiconductor substrate; an interconnection formed in the first groove; and a bonding pad formed in the second groove;

the second groove being deeper than the first groove; and the bonding pad having a dimple on a top surface thereof.

According to the further feature of the invention, in a method for fabricating a semiconductor device, the semiconductor device comprising first and second interfacial insulating films successively grown on a semiconductor substrate; and upper and lower interconnections and a bonding pad provided in the second interfacial insulating film; the method, comprises the steps of:

forming the lower interconnection on the first interfacial insulating film;

forming the second interfacial insulating film on the first interfacial insulating film to cover the lower interconnection and a whole surface of the first interfacial insulating film;

etching the second interfacial insulating film to provide a first groove for the upper interconnection and a second groove for the bonding pad;

etching bottoms of the first and second grooves, the first groove being connected via a through-hole to the lower interconnection, the second groove having a depth equal to or below a horizontal level of a top surface of the lower interconnection;

forming a metal film on the second interfacial insulating film, the first and second grooves and the through-hole being buried with the metal film; and polishing the metal film to be removed except for the metal film in the first and second grooves and the through-hole, the metal film in the first groove being the upper interconnection, and the metal film in the second groove being the bonding pad having a dimple thereon.

BRIEF DESCRIPTION OF THE DRAWINGS

The invention will be explained in more detail in conjunction with appended drawings, wherein:

FIGS. 1A to 1D are schematic cross-sectional views showing a conventional method for fabricating a semiconductor device; and FIGS. 2A to 2D are schematic cross-sectional view showing a method for fabricating a semiconductor device in a preferred embodiment according to the invention.

DESCRIPTION OF THE PREFERRED EMBODIMENTS

Before describing a method for fabricating a semiconductor device in a preferred embodiment according to the invention, the aforementioned conventional method for fabricating a semiconductor device will be explained in FIGS. 1A to 1D.

In FIG. 1A, a lower interconnection 3 of Al, etc. is formed on a silicon dioxide film 2 provided on a silicon substrate 1, and a silicon dioxide film 4 is formed on the whole surface of the silicon dioxide film 2 to be an interfacial insulating film. Then, grooves 5A to 5C for interconnection and bonding pad are formed by lithography and etching processes.

In FIG. 1B, a through-hole 7 is formed at the groove 5A above the lower interconnection 3 through the silicon dioxide film 4.

In FIG. 1C, an interconnection film of Al, etc. is formed on the whole surface of the processed silicon dioxide film 4 by sputter process or CVD process, and upper interconnections 8A to 8C are formed only in the grooves 5A to 5C and the through-hole 7 as a result of polishing the interconnection film by using CMP process.

In FIG. 1D, a dimple 10A is formed in the central portion of a bonding pad 9A in accordance with the so-called dishing phenomenon in which the metal upper interconnections 8B and 8C having a polishing rate faster than that of the silicon dioxide film 4 are more polished by CMP process.

Next, a method for fabricating a semiconductor device in the preferred embodiment will be explained in FIGS. 2A to 2D.

In FIG. 2A, diffusion layers (not shown) for composing a semiconductor device are formed in an upper skin layer of a semiconductor substrate 1, and a silicon dioxide film 2 having a thickness of approximately 1 μm is formed thereon for a first interfacial insulating layer by CVD process. Then, a lower interconnection 3 is formed on the silicon dioxide film 2 by patterning an Al film having a thickness of 1 μm provided thereon, and a silicon dioxide film 4 having a thickness of 3 μm is formed thereon for a second interfacial insulating layer by CVD process. The silicon dioxide film 4 is polished to be flat on a top surface by CMP process.

In FIG. 2B, the silicon dioxide film 4 is patterned to provide a first groove 5 having a depth of approximately 1 μm for an interconnection and a second groove 6 having the same depth for a bonding pad by lithograph and etching processes.

In FIG. 2C, the silicon dioxide film 4 is again patterned to provide a through-hole 7 between the first groove 5 and the lower interconnection 3 and a groove 6a for deepening the second groove 6. The step of this etching process is effected at the time when the lower interconnection 3 is exposed on a top surface, or a predetermined time is elapsed to provide an over-etching state to a predetermined extent after the exposure of the lower interconnection 3. As a result, a horizontal level of the groove 6a is defined to be the same on a bottom surface as, or lower than the exposed surface of the lower interconnection 3 as indicated by X.

In FIG. 2D, an Al film is formed on the whole surface of the processed silicon dioxide film 4 having the shallow groove 5 and the deep groove 6, 6a by high temperature sputter process in which the semiconductor substrate 1 is heated, and the Al film thus formed is polished to provide an upper interconnection 8 and a bonding pad 9 having a dimple 10 by CMP process.

In the preferred embodiment, the second groove 6, 6a has depth at least equal to the top surface of the lower interconnection 3 in accordance with the simultaneous etching with the through-hole 7, so that the bonding pad 9 having a sufficient thickness is obtained. Consequently, any extinction of the Al layer does not occur in the central portion of the bonding pad 9, even if the dimple 10 is formed thereon in accordance with the dishing phenomenon.

In one example, a groove having an area of 100×100 μm$^2$ and a depth of 2.2 μm is formed in a silicon dioxide film 4 having a thickness of 3 μm in the same manner as shown in FIG. 2C. Then, the groove is buried with an Al film in FIG. 2D, and the Al film is polished on a top surface by CMP process. Thus, a dimple having a depth of approximately 1.2 μm is formed thereon in accordance with the dishing phenomenon. In spite of this dimple thus formed, the Al film having a remaining thickness of 1 μm still remains left in the central portion of the Al groove burying film. Consequently, a wire bonding to the Al film can be effectively carried out without any fault.

In the preferred embodiment, the Al film may be replaced by a Si film, a Cu film, an Al alloy film, or a tungsten film.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A semiconductor device, comprising:

a semiconductor substrate; an insulating film provided on said semiconductor substrate; an upper interconnection formed in said insulating film; and a bonding pad formed in said insulating film;

said upper interconnection being connected via a through-hole to a lower interconnection; and said bonding pad having a thickness to provide a bonding pad lower surface that extends below a horizontal level of a top surface of said lower interconnection; and said bonding pad having a dimple on a top surface thereof, and having a thickness greater than a depth of said dimple, and a bottom surface level of said dimple being lower than a top surface level of said upper interconnection.

2. A semiconductor device, according to claim 1, wherein:

said bonding paid has a top surface area which is greater than a top surface area of said upper interconnection.

* * * * *